United States Patent [19]

Naden

[11] 4,141,076

[45] Feb. 20, 1979

[54] ASSOCIATIVE BUBBLE MEMORY APPARATUS

[75] Inventor: Rex A. Naden, Richardson, Tex.

[73] Assignee: The United States of America as represented by the Secretary of the Air Force, Washington, D.C.

[21] Appl. No.: 809,729

[22] Filed: Jun. 24, 1977

[51] Int. Cl.² .................. G06F 7/50; G11C 11/14
[52] U.S. Cl. .................................... 364/714; 364/716; 365/1; 365/4; 365/5; 365/50
[58] Field of Search ............... 364/714, 716; 365/1, 365/4, 5, 49, 50

[56] References Cited

U.S. PATENT DOCUMENTS

| 3,508,220 | 4/1970 | Stampler | 365/50 |
| 3,701,125 | 10/1972 | Chang et al. | 365/4 |
| 3,732,551 | 5/1973 | Homma et al. | 365/4 X |
| 3,761,886 | 9/1973 | Kluge | 365/5 X |
| 3,983,383 | 9/1976 | Naden | 364/714 |
| 3,986,016 | 10/1976 | Linn et al. | 364/714 |
| 4,032,905 | 6/1977 | Chen | 365/4 |

Primary Examiner—Jerry Smith
Attorney, Agent, or Firm—Joseph E. Rusz; William Stepanishen

[57] ABSTRACT

An associative bubble memory apparatus utilizing a plurality of registers therein to provide a high total memory capacity and to provide data retrieval or correlation based upon content rather than the address of the data of interest.

7 Claims, 5 Drawing Figures

--- CURRENT PATH
—— BUBBLE PROPAGATION PATH

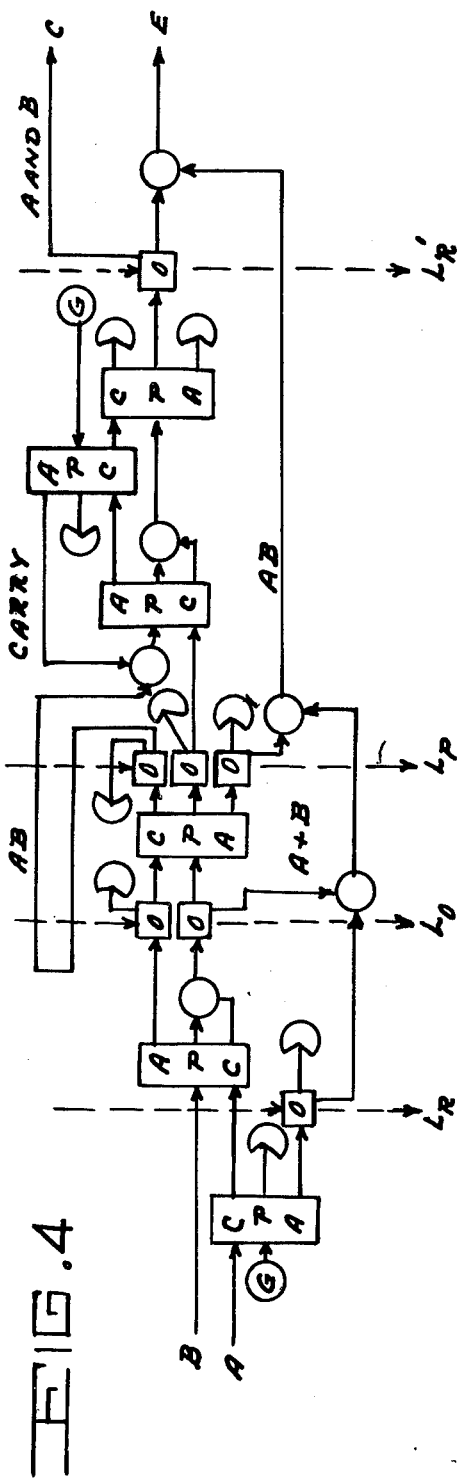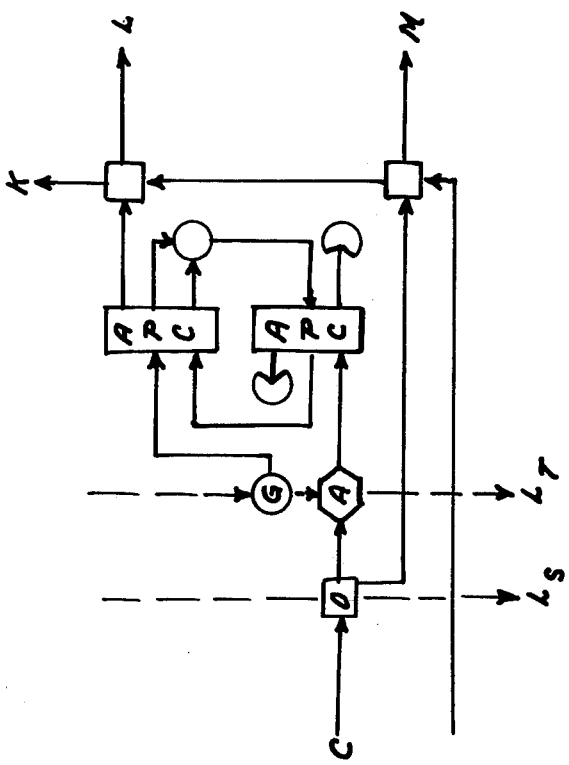
FIG. 4
FIG. 5

ASSOCIATIVE BUBBLE MEMORY APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to magnetic bubble domains, and in particular to an associative bubble memory apparatus.

In the present state of the art computer memories, information is stored in one of two magnetic states on a magnetic material. The unique characteristics of magnetic materials enable them (1) to hold one of two magnetic states (direction of magnetization) in the absence of power (nonvolatility), (2) to be quickly alterable between states with a small amount of input power, (3) to be readable at high speeds by means resulting in a system-compatible electric current flow, and (4) to store large amounts of information by providing extremely high geometric densities of magnetization. These characteristics have caused magnetic memory devices to supersede most prior attempts at memory design, and such devices will continue to be useful for a long time into the future. Electrostatic storage in cathode ray tubes and mercury delay lines has been made obsolete by magnetic cores and drums.

Magnetic core memories may be classified as discrete stationary medium memories. Each core is capable of storing only one bit. A "zero" is represented by magnetizing the doughnut-shaped core so that the flux direction is, say, clockwise, while a "one" is represented by the opposite direction of magnetization. The core is set by a current flowing in a wire through the center of the core. A rectangular grid of wires, with a core surrounding each wire crossing, is called a plane. Selective setting of cores is accomplished by passing half currents (half the amount required for switching) through the grid wires. Only those cores will be set where the half currents coincide and thus exceed the switching threshold of the cores. A stack of planes is a memory array. For a word length of 16 bits, an array of 16 planes, each holding 1024 cores, would be called a 1024 word, coincident current, word addressable memory.

The speed of core memories is limited by the switching time of the cores, the length of the wires in the arrays, and the pulse length and frequency of the drive and recovery time of the read or sense amplifiers.

SUMMARY

The present invention utilizes magnetic bubble domains to provide an associative memory apparatus wherein access to the memory data is achieved through the content rather than the address of the data being retrieved. This enables the rapid searching of the memory for a given bit-pattern to determine its presence, and to report its location or locations where it is stored if it is present. The associative memory apparatus includes an arithmetic logic unit to perform such functions as the AND function on all words in the memory with respect to a given key word which is applied as an input to the memory apparatus. The arithmetic logic unit may also be utilized to perform the OR functions and the binary ADD. The associative memory apparatus also has the capability to read and write data into random location in the memory in the same manner as a conventional memory.

It is one object of the present invention, therefore, to provide a new and improved associative bubble memory apparatus.

It is another object of the invention to provide an improved associative bubble memory apparatus that allows access to memory data by content rather than by the address of the data in the memory.

It is still another object of the invention to provide an improved assocative bubble memory apparatus having the capability of performing logical operations on an array of memory words.

It is yet another object of the invention to provide an improved associative bubble memory apparatus which may be utilized to read and write data words into random locations.

These and other advantages, objects and features of the invention will become more apparent from the following description taken in conjunction with the illustrative embodiment in the accompanying drawings.

BRIEF DESCRIPTION OF THE DRAWINGS

FIG. 4 is a block diagram of the arithmetic logic unit for the associative bubble memory apparatus, and FIG. 5 is a block diagram of the correlator unit for the associative bubble memory apparatus.

DESCRIPTION OF THE PREFERRED EMBODIMENT

The present invention is an associative memory chip apparatus which permits access to memory via the content rather than the address of the data being retrieved. This is equivalent to searching a memory for a given bit pattern to determine if it is present; and if it is present, to report the locations where it is stored. The present invention includes the capability of the simultaneous performance of logical operations on an array of memory words. For example, the present apparatus can perform the AND function on all words in the memory with respect to the chip. In addition to the AND function, the apparatus can perform the function OR and the binary ADD.

The present associative bubble memory apparatus which utilizes associative processing to perform logic operations, may also operate similar to a conventional self-contained chip for reading and writing, with 256 registers containing 512 bits each for a total memory capacity of 128 K bits. The bubble size in the present apparatus is 0.5 $\mu$m.

Figure 1:
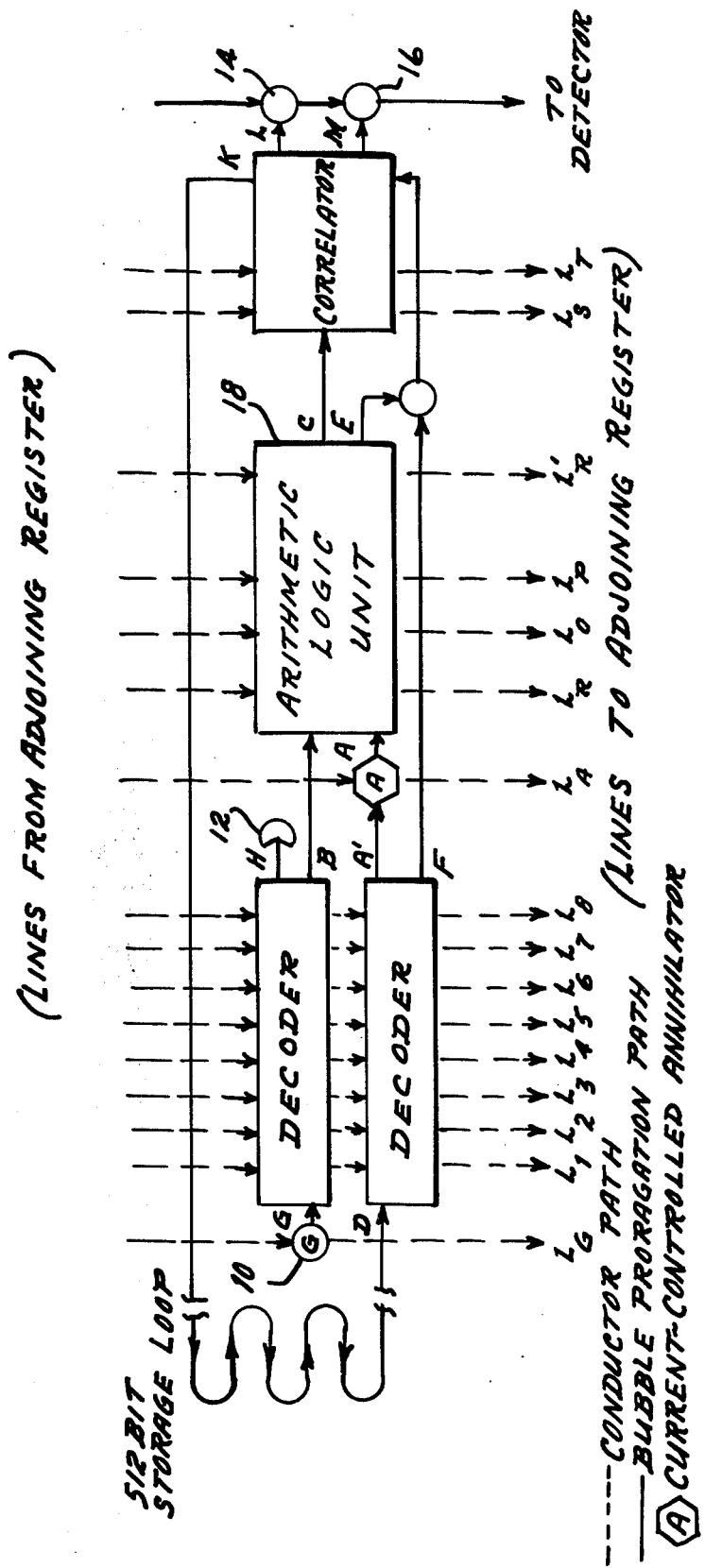
FIG. 1 is a block diagram of the associative bubble memory apparatus in accordance with the present invention.

Referring now to FIG. 1, there is shown an associative memory register apparatus containing logic circuits and a pair of address decoders for each register. The associative bubble memory apparatus is comprised of a plurality of chips containing 256 register units (one complete unit of which is shown in FIG. 1), each of which having read-write addressing requiring eight current and eight control lines for operation. The current lines are designated $L_1$ through $L_8$. The control lines are designated $L_G$, $L_A$, $L_R$, $L_O$, $L_P$, $L_R$, $L_S$, and $L_T$. The other symbols which are used are shown in Table I.

TABLE I

G = Generator
A = Annihilator
= Disjoint Crossover
= Exclusive Merge
= Transient Bubble Switch The symbol for the current-controlled annihilator is defined in FIG. 1. The sixteen current lines are common to all 256 registers on the chip.

Figure 3:
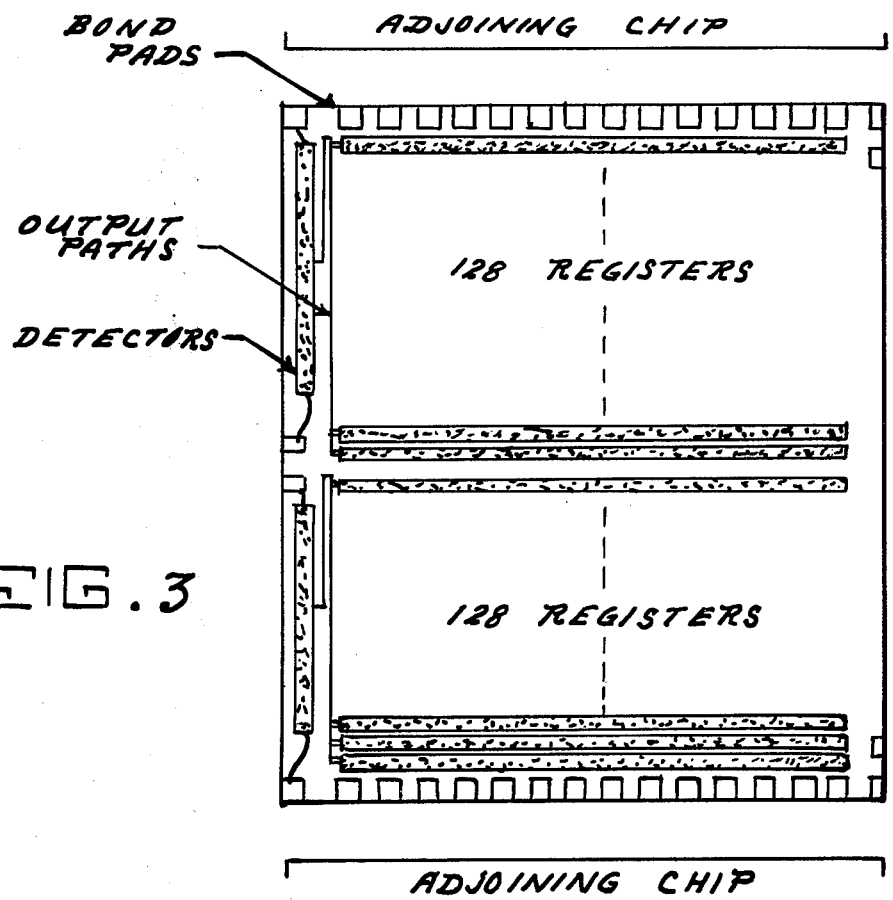
FIG. 3 is a schematic diagram of the associative bubble memory apparatus chip with 128 512-bit registers.

The only input is a single generator 10 in each register, controlled by line $L_G$. Since this line is common to all registers, the generated bubbles are destroyed by the bubble eater 12 at H in all registers except the one selected by the address lines. Bubble output is accomplished with detectors 14, 16 that are connected to each register in daisy-chain fashion by paths L and M. For faster access, there are two detectors per chip as shown in the schematic chip layout in FIG. 3. Each detector serves 128 registers. Bond pad placement to allow easy multiple-chip serial interconnection is also shown in FIG. 3.

The control of the associative memory chip which is described in terms of bubble streams is shown in Table II below.

Type 1 switches divert bubbles with normal current flow. The switch actions are reversed when the current is flowing in the reverse direction. Each register in the memory has a unique set of switch types so that register selection can be accomplished. The combination $00101101_2$ is shown as an example in FIG. 2 to indicate the required switch set for register number $45_{10}$. The subscript is used to indicate the number base: 2 for binary, 10 for decimal.

There is shown in FIG. 4 a schematic diagram of the arithmetic logic unit for the associative processor portion of the associative bubble memory apparatus. The arithmetic logic unit is controlled by the four conductors shown with normal current flow indicated.

The operational states are listed in Table III along with the necessary directional current controls for implementing those states. With all currents in the normal direction, the arithmetic logic unit operates as a full adder.

The correlator circuit is shown in FIG. 5. Operation of the correlation is explained by a simple example. Three five-bit fields containing the numbers $+7_{10}$, $-7_{10}$, and $+5_{10}$ are compared with the search key of $+5_{10}$. The two's complement of the search key ($11011_2$) is written into all registers simultaneously via control lead $L_G$. The input word is then added to each field and the sum transmitted to the correlator circuit via path C.

TABLE II

| Operation | Selected Register or All Registers | G | Selected Paths B | A | A | Paths Not Selected H | F | ALU Outputs C | E | Return to Storage K |
|---|---|---|---|---|---|---|---|---|---|---|
| WRITE | Selected | Data to Be Written | G | D | D | O | O | O | C | G |
| WRITE | All but Selected | Data to Be Written | D | O | O | G | D | O | O | D |
| READ | Selected | O | O | D | D | O | O | D | D | D |
| READ | All but Selected | O | O | O | O | O | D | O | O | D |
| COMPARE | ALL | Input Key | G | D | D | O | O | G Plus D | D | D |
| ADD | All | Data to Be Added | G | D | D | O | O | O | G Plus D | G Plus D |
| AND | ALL | Data to Be ANDed | G | D | D | O | O | O | G · D | G · D |
| OR | All | Data to Be ORed | G | D | D | O | O | O | G + D | G + D |
| Circulate | All | O | O | O | O | O | D | O | O | D |

The path symbols are as given in FIG. 1. The functions to be performed are listed on the left-hand side of the table, and the required paths which are followed by the generate stream G and the data stream D are shown on the right-hand side. It may be noted that the chip is capable of performing destructive logical operations on arbitrary fields of its register contents in addition to the READ, WRITE, and COMPARE functions. This extra logical capability is available because the logic products were easily available in the arithmetic logic unit, 18.

Figure 2:
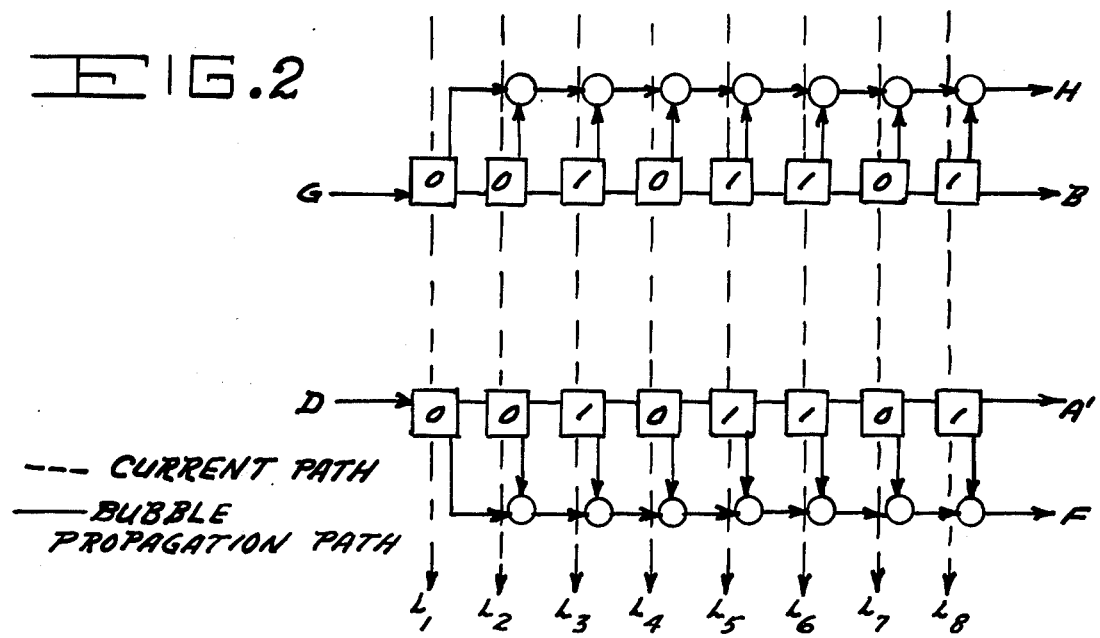
FIG. 2 is a block diagram of the current-controlled switch decoders for the associative bubble memory apparatus.

Turning now to FIG. 2, there is shown the current-controlled switch decoders for associative memory apparatus. The switch arrangment for register number $45_{10} = 00101101_2$ is shown. Eight lines with bipolar drivers are required for selecting a given register. Eight current-controlled address lines are needed for register selection on the chip. Each line passes through two current-controlled bubble switches. The two decode circuits are required for each register as shown in FIG. 1. Two types of bipolar current switches are employed, designated by the labels "0" and "1". Type 0 switches do not switch bubbles from their path when current is flowing in the normal direction as indicated by arrows.

The correlator circuit is then controlled by two wires to perform the following sequence: first, the sign bit is stripped off and sent to M for output. Second, the carry bit is annihilated because it is not necessary to the process. Third, the presence or absence of bubbles in the sum is tested and the result is sent through output 1.

TABLE III

| | Conductors | | | | Outputs | |
|---|---|---|---|---|---|---|
| Operation | $L_R$ | $L_R'$ | $L_O$ | $L_P$ | C | E |
| WRITE | N | N | N | N | O | O Plus B = B |
| READ | R | R | N | N | A Plus O = A | A Plus O = A |
| COMPARE | R | R | N | N | A Plus B | A |
| ADD | N | N | N | N | O | A Plus B |
| AND | N | N | R | N | O | AB |
| OR | N | N | N | R | O | A + B |
| Circulate | X | X | X | X | O | O |

N = normal current flow, R = reversed current flow, X = either current flow.
Note that $L_R$ and $L_R'$ may be driven in parallel by the same electronic drive circuit.

The truth table for decoding the correlator outputs is given below.

| M | L | Result |
|---|---|---|
| 0 | 0 | Key < Field |
| 0 | L | Key = Field |
| 1 | 0 | Key > Field |
| 1 | 1 | Undefined |

The correlator outputs from each register are placed on the same path for transmission and serial detection as seen in FIG. 1.

A summary of the functional elements in the associative memory is given in Table IV. The density of these elements using 0.5 μm bubbles should allow realization on a 100 × 100 mil² active chip area. A 128 K bit organization with 128 registers of 1024 bits each may be required, depending on the width-to-length ratio of the logic blocks.

In summary, a 128 K bit associative memory chip is disclosed using 0.5 μm bubble technology and functional logic elements. The applications of such a device are centered in the data processing areas of (1) file manipulation, (2) hardware-aided compiler programs, and (3) real-time surveillance and control. The third application includes the specific areas of air-traffic control (e.g., the STARAN computer) and surveillance satellite processing.

TABLE IV

| Element | Description | Number in Each Register | Total Number on Chip | |
|---|---|---|---|---|
| Switch | Current Controlled | 24 | 6144 | |
| | Permalloy (transient logic) | 8 | 2048 | |
| | Current Controlled | 2 | 512 | |
| Generator | Permalloy | 2 | 512 | |
| | Current Controlled | 2 | 512 | |
| Annihilator | Permalloy | 12 | 3072 | |
| Merge | Permalloy | 25 | 6400 | |
| Crossover | Permalloy | 25 | 512 | |
| Memory Locations | Permalloy | 512 | 128 | K |
| Control Lines | Conductor | 8 | 8 | |
| Address Lines | Conductor | 8 | 8 | |
| Detector | Permalloy | 0 | 2 | |
| Bond Pads | | 0 | 36 | |

The surveillance satellite application satisfies the need for on-board signal processing for deriving true targets from the raw data generated by a focal plane sensor array. The processor would perform scan-to-scan correlation for tracking and X-coincidence correlation for noise rejection, thus reducing the net volume of data to be sent via the limited bandwidth telemetry. The attractive system characteristics offered by the magnetic bubble associative processor include radiation-hardness, low power, low volume, and low weight.

Although the invention has been described with reference to a particular embodiment, it will be understood to those skilled in the art that the invention is capable of a variety of alternative embodiments within the spirit and scope of the appended claims.

What is claimed is:

1. An associative bubble memory register apparatus comprising in combination:
    a plurality of registers on a chip, each register of said plurality of registers being comprised of magnetic bubble domains, each magnetic bubble domain having a predetermined bubble size, each register of said plurality of registers forming an open propagation storage loop, said storage loop being capable of storing a predetermined number of bits, and
    a plurality of decoder units respectively connected to said plurality of registers, each decoder unit of said plurality of decoder units being connected respectively to only one register of said plurality of registers, said plurality of decoder units respectively receiving a predetermined number of conductor lines, said conductor lines providing access to the register content, said conductor lines providing the capability of reading and writing words into and out of said plurality of registers.

2. An associative bubble memory register apparatus as described in claim 1 further including a plurality of arithmetic logic units respectively connected to each decoder unit of said plurality of decoder units for the simultaneous performance of logical operations on the array of words stored with said plurality of registers, said plurality of arithmetic logic units receiving a predetermined number of control lines, said predetermined number of control lines carrying the control signal to control the logical operations within each arithmetic logic unit of said plurality of arithmetic logic units, and,
    a plurality of correlator units respectively connected to said plurality of arithmetic logic units, said plurality of correlator units respectively receiving data from said plurality of decoder units, said plurality of correlator units being respectively connected to said plurality of registers, said plurality of correlator units being utilized to locate and identify a specific word stored in said plurality of registers.

3. An associative bubble memory register apparatus as described in claim 2 wherein said predetermined number of control lines equal four.

4. An associative bubble memory register apparatus as described in claim 2 wherein a plurality of control lines are utilized by said bubble memory register apparatus, said plurality of control lines equals eight.

5. An associative bubble memory register apparatus as described in claim 1 wherein said plurality of registers comprises 256 magnetic bubble domain storage registers per chip.

6. An associative bubble memory register apparatus as described in claim 1 wherein said predetermined number of bits equals 512 bits per storage loop for a total memory of 128 kilobits.

7. An associative bubble memory register apparatus as described in claim 1 wherein said predetermined bubble size is 0.5 μm.

* * * * *

UNITED STATES PATENT AND TRADEMARK OFFICE
CERTIFICATE OF CORRECTION

PATENT NO. : 4,141,076
DATED : February 20, 1979
INVENTOR(S) : Rex A. Naden

It is certified that error appears in the above-identified patent and that said Letters Patent are hereby corrected as shown below:

Column 2, line 68, change "$L_R$" (second occurrence) to
$$-- L_R^1 --$$

Column 4, Table III, change "$L_R$" (second occurrence) to
$$-- L_R^1 --$$

[SEAL]

Signed and Sealed this

Third Day of July 1979

Attest:

Attesting Officer

LUTRELLE F. PARKER
Acting Commissioner of Patents and Trademarks